United States Patent [19]

Minou et al.

[11] 4,164,710

[45] Aug. 14, 1979

[54] VERY HIGH FREQUENCY TUNER FOR ELIMINATING IMAGE INTERFERENCE AND STRAY CAPACITANCE EFFECTS

[75] Inventors: Shigemitsu Minou, Neyagawa; Shuhei Kamada, Tsuzuki, both of Japan

[73] Assignee: Sanyo Electric Co., Ltd., Osaka, Japan

[21] Appl. No.: 775,406

[22] Filed: Mar. 7, 1977

[30] Foreign Application Priority Data

Mar. 5, 1976 [JP] Japan .............................. 51-26507[U]
Mar. 15, 1976 [JP] Japan .............................. 51-32505[U]

[51] Int. Cl.$^2$ .............................................. H04B 1/10
[52] U.S. Cl. ..................................... 325/464; 325/377; 325/387; 325/437; 325/439; 325/490
[58] Field of Search ................ 325/318, 319, 377–381, 325/383, 387, 437, 439, 452, 457, 461, 463, 488–490, 464, 388; 330/176; 331/77; 334/14, 15, 56, 71

[56] References Cited

U.S. PATENT DOCUMENTS

| | | | |
|---|---|---|---|
| 1,831,640 | 11/1931 | Roberts | 330/176 |
| 2,514,357 | 7/1950 | Burgett | 330/176 |
| 2,581,159 | 1/1952 | Achenbach | 325/490 |
| 2,790,035 | 4/1957 | Hylas et al. | 330/176 |
| 3,207,990 | 9/1965 | Nestlerodz | 325/488 |
| 3,305,784 | 2/1967 | Chalmers et al. | 325/461 |
| 3,441,865 | 4/1969 | Siwko | 330/176 |

*Primary Examiner*—Robert L. Griffin
*Assistant Examiner*—Jin F. Ng
*Attorney, Agent, or Firm*—Armstrong, Nikaido, Marmelstein & Kubovcik

[57] ABSTRACT

A very high frequency tuner for selection of a broadcasting signal through mechanical switching selection of inductance coils, comprising a radio frequency amplifying transistor of an automatic gain control type connected to amplify a high frequency signal, a single tuned coupling circuit coupled to said high frequency amplifying transistor for selectively withdrawing a tuned high frequency signal, a local oscillator for providing a local oscillation frequency signal the frequency of which is different by a given frequency difference from the said selectively withdrawn tuned high frequency signal, a mixer responsive to the tuned high frequency signal from the tuned coupling circuit and the local oscillation frequency signal for providing an intermediate frequency signal, an automatic gain control signal source for applying the automatic gain control signal to the high frequency amplifying transistor, said transistor having a stray capacitance at the output thereof, said single tuned coupling circuit comprising a $\pi$ type single tuned coupling circuit comprising mechanically selected coil arranged in a series fashion between the output of the high frequency amplifying transistor and the input of the mixer, an input capacitor connected to the input terminal of the selected inductance coil in a shunt manner and a second capacitor connected to the output terminal of the inductance coil in a shunt manner, whereby said stray capacitance being shunted by said input capacitor.

4 Claims, 13 Drawing Figures

VERY HIGH FREQUENCY TUNER FOR ELIMINATING IMAGE INTERFERENCE AND STRAY CAPACITANCE EFFECTS

BACKGROUND OF THE INVENTION

1. Field of the Invention

The present invention relates to a very high frequency tuner, and more specifically relates to an improvement in a tuned coupling circuit between a high frequency amplifier and a frequency converter in a very high frequency tuner, particularly for use in television receivers.

2. Description of the Prior Art

A typical prior art very high frequency tuner comprises a high frequency amplifier and a frequency converter, with a tuned coupling means interposed therebetween. One type of such a tuned coupling means comprises a double tuned coupling circuit i.e. a pair of inductively coupled tuned circuits. The other type of such a tuned coupling means comprises a single tuned coupling circuit. In comparison of these, a single tuned circuit is more advantageous from the standpoint of economy and fabrication of the same.

FIG. 1 shows a schematic diagram of only a major portion of a typical conventional turret type tuner for use in a very high frequency or VHF television receiver. Referring to FIG. 1, the tuner is shown comprising a transistor TR1 implementing a high frequency amplifier and a transistor TR2 implementing a frequency converter, interconnected by a single tuned coupling circuit comprising an inductance coil and capacitors connected thereto. The said single tuned coupling circuit comprises a selected one of tuning inductance coils L1, L2, L3, . . . , which is connected at one terminal a to a common bus 1' through a capacitor C3 and is shunted at the other terminal b by a series connection of capacitors C1 and C2. More specifically, the inductance coils L1, L2, L3 . . . are provided on a turret plate such that each is individually associated with each channel, whereby rotation of the tuner shaft makes selective connection of each coil to the terminals a and b. The transistor TR1 comprises a typical bipolar type transistor of NPN type having collector, base and emitter electrodes and is connected in a common emitter fashion. One terminal b for the coil is connected to the collector electrode of the transistor TR1, while the other terminal a of the coil is connected through the capacitor C3 to the common bus 1'. The base electrode serving as an input electrode is connected to the input terminal 1. It is well known to those skilled in the art that in a high frequency amplifier employing a transistor connected in a common emitter fashion a negative feedback loop is formed through a stray capacitance between the base and collector electrodes and hence a neutralizing signal obtainable from the output is applied to the input electrode for the purpose of neutralizing the said feedback operation through the stray capacitance between the base and collector electrodes. In the FIG. 1 diagram, the capacitor C3 has been inserted for the purpose of obtaining such a neutralizing signal. The neutralizing signal obtained at the junction a of the capacitor C3 and the inductance coil is applied through a neutralizing capacitor C4 to the base electrode of the transistor TR1. The coil to be selected at the terminals a and b and the capacitor C3 connected thereto are shunted by a series connection of the capacitors C1 and C2 provided for the purpose of capacitance division for applying the output to the succeeding stage. It would be appreciated that the coil selected at the terminals a and b and the capacitors C1, C2 and C3 to be connected in series with the coil constitute a tuned or resonance circuit. The transistor TR2 also comprises a typical bipolar NPN type transistor having collector, base and emitter electrodes connected in a common emitter fashion. The output signal obtainable from the preceding stage at the capacitance divided terminal is applied to the base electrode of the transistor TR2. The base electrode of the transistor TR2 is also connected from a local oscillator, not shown, through a capacitor C5 and is connected to a succeeding intermediate frequency amplifying circuit through a capacitor C6. Returning again to the transistor TR1, the high frequency amplifying transistor TR1 is typically connected to form an amplifier of an automatic gain control type. To that end, the base electrode of the transistor TR1 is connected to receive an automatic gain control signal from a terminal AGC. In this connection it should be pointed out that the transistor TR1 comprises a stray capacitance between the collector and emitter electrodes which is variable as a function of the magnitude of the automatic gain control signal to be applied to the transistor TR1, as to be more fully discussed subsequently.

FIG. 2 shows a simplified schematic diagram of the FIG. 1 tuner where a specified channel is selected, wherein the neutralizing circuit has been omitted for simplicity of consideration of the circuit. Since the same portions have been denoted by the same reference characters, the circuit connection is self-explanatory. Now let it be assumed that a signal of the frequency much higher than the frequency of a desired receiving channel is applied to the input terminals 1 and 1'. Then the impedance of the inductance coil L1 with respect to such a high frequency interference signal becomes accordingly such larger. Therefore, it follows that the inductance coil L1 becomes negligible with respect to such a high frequency interference signal. FIG. 3 shows an equivalent circuit of the FIG. 2 diagram with respect to such a high frequency interference signal wherein the inductance coil L1 has been omitted. Referring to FIG. 3, it would be appreciated that such a high frequency interference signal obtainable from the high frequency amplifying transistor TR1 is capacitance divided at the rate of C1/C1+C2 and is transferred to the succeeding frequency converting transistor TR2. Thus a conventional VHF tuner employing a single tuned coupling circuit suffers from the shortcomings that such a high frequency interference signal of the frequency much higher than the receiving frequency is transferred through the coupling circuit from the high frequency amplifying transistor TR1 to the frequency converting transistor TR2 but nevertheless it is difficult to block such a high frequency interference signal.

Transmission of such an interference signal to the frequency converting stage will now be more specifically considered. Assuming that the central frequency f1 of a given low channel in the VHF television channels is received, the local oscillating frequency f0 of the tuner is selected with respect to the central frequency f1 of the said broadcasting channel to the value that meets the relation of f0−f1=56.5 MHz which is commensurate with the intermediate frequency of the receiver in case of the Japanese standard television system. Such intermediate frequency signal thus obtained based upon the said desired broadcasting signal is applied to the succeeding video intermediate frequency circuit in the television receiver. As well known to those skilled in the art, such frequency conversion is often referred to as the upper side superheterodyne. Assuming that in such a situation a broadcasting signal in a certain high band of the frequency f2 that meets the relation of $f2-f0=56.5$ MHz is received by the high frequency amplifying transistor TR1 and the output therefrom is applied to the frequency converting transistor TR2, it follows that the intermediate frequency signal obtained based upon the said high band channel signal is also applied to the succeeding video intermediate frequency circuit. Such intermediate frequency signal obtained based upon the undesired high band channel signal could cause an interference on the image appearing on the screen of the television receiver. Taking an example, the signal of the channels Nos. 10 through 12 could cause such an interference when the signal of the channels Nos. 1 through 3 is received. Thus, it would be appreciated that it is necessary that consideration is given to prevent or block such a high band channel signal of the frequency f2 from being transferred to the frequency converting transistor TR2. The same also applies to a ultra high frequency or UHF broadcasting signal the frequency of which is different by 56.5 MHz from the harmonic frequency nf0 of the local oscillating frequency f0. Hence, it is also required that such a UHF signal is also prevented from being transferred to the frequency converting stage for the same reason.

Another serious problem contered with a VHF tuner employing a single tuned coupling circuit interposed between a high frequency amplifying transistor and a succeeding frequency converting transistor is an adverse effect of the output stray capacitance of the high frequency amplifying transistor upon the tuned circuit and thus to the tuning frequency of the single tuned coupling circuit. Such an adverse effect caused by an output stray capacitance of the high frequency amlifying transistor in the tuner will now be more specifically considered. As well known to those skilled in the art and as briefly discussed in the foregoing, a typical conventional VHF tuner comprising a high frequency amplifying transistor and a frequency converter with a coupling circuit interposed therebetween is supplied with an automatic gain control signal, so that the gain in the tuner is automatically controlled as a function of the automatic gain control signal. Again referring to FIG. 1, such an automatic gain control signal is typically applied through the terminal AGC to the input electrode, i.e. the base electrode of the high frequency amplifying transistor TR1. On the other hand, the transistor TR1 comprises a stray capacitance between the output electrode, i.e. the collector electrode and the common electrode, i.e. the emitter electrode. It is well known to those skilled in the art that such a stray capacitance of the transistor TR1 is varied as a function of the magnitude of the automatic gain control signal to be applied to the input electrode of the transistor TR1. Such a stray capacitance serves to shunt the inductance coil L1 together with the series connection of the capacitors C1 and C2. Thus, the tuning frequency of the single tuned coupling circuit is determined by the values of the inductance of the coil L1 and the resultant capacitance of the capacitors C1, C2 and C3 and the said stray capacitance. In considering the tuning frequency of the tuned circuit, since the capacitance of the capacitor C3 is relatively large, the resultant capacitance of the capacitors C1 and C2 and the said tray capacitance is dominant. Since the tuned coupling circuit shown in FIGS. 1 and 2 comprises a series connection of the capacitors C1 and C2 shunting the inductance coil L1, the resultant capacitance of the series connected capacitors C1 and C2 is calculated as $C1 \cdot C2/C1+C2$ and becomes relatively small as compared with the capacitance value of each capacitor. Variation of the said stray capacitance causes an adverse affect upon the tuning frequency of the tuned coupling circuit at the rate of the stray capacitance to the said resultant capacitance of a relatively small value. Thus in order to reduce any adverse affect by the said stray capacitance at the output end of the high frequency amplifying transistor, it is desired to select a larger resultant capacitance value of the said series connection of the capacitors C1 and C2, insofar as it is possible. Nevertheless, in order to adopt a larger resultant capacitance value of these capacitors C1 and C2, it is necessary to select a smaller inductance value of the coil L1 to obtain a predetermined tuning frequency. As readily understood, there is a limit in selecting a smaller inductance value of the coil L1 from the standpoint of fabrication. Thus, in designing a VHF tuner employing a single tuned coupling circuit, a dilemma is encountered that a larger resultant capacitance of the capacitors C1 and C2 is desired but nevertheless there is a limit from the standpoint of fabrication of the inductance coil L1.

A television tuner of interest is disclosed in the U.S. Pat. No. 3,305,784, issued Feb. 21, 1967 to Chalmers et al. The referenced patent depicts a UHF television tuner comprising a double tuned coupling circuit, i.e. a pair of inductively coupled tuned circuits. Each of these tuned circuits is shown comprising an inductance coil arranged for inductive mutual coupling which is connected to a $\pi$ type circuit comprising another inductance coil interposed in a series fashion both ends of which are connected through capacitors to the ground in a shunt fashion. Thus it would be appreciated that the $\pi$ type circuit is employed in each of tuned circuits as a tuning circuit component cooperatively coupled to the said first mentioned inductive coupling inductance coil. Hence the reference patent fails to contemplate simplification of the tuned coupling circuit in that a double tuned coupling circuit has been employed. Moreover, the reference patent fails to teach or suggest an improvement in an adverse affect of the stray capacitance at the output of the high frequency amplifying circuit upon the tuning frequency of the tuned circuit caused by variation of the magnitude of the automatic gain control signal to be applied to the high frequency amplifier.

SUMMARY OF THE INVENTION

Briefly described, the present invention comprises a VHF tuner for selection of a broadcasting signal through mechanical switching selection of inductance coil means, comprising radio frequency amplifying transistor means of an automatic gain control type for amplifying a high frequency signal, tuned coupling means coupled to said high frequency amplifying transistor means for selectively withdrawing a tuned high frequency signal, local oscillating means for providing an oscillation frequency signal the frequency of which is different by a given frequency difference from said selectively withdrawn tuned high frequency signal, mixing means responsive to said selectively withdrawn tuned high frequency signal from said tuned coupling means and said local oscillation frequency signal from said local oscillating means for providing an intermediate frequency signal of the difference frequency therebetween, means for providing an automatic gain control signal to said high frequency amplifying transistor means, said high frequency amplifying transistor means comprising a stray capacitance at the output thereof, said tuned coupling means comprising a π type single tuned coupling circuit comprising said selected inductance coil means arranged in a series fashion between the output of said high frequency amplifying transistor and the input of said mixing means, first capacitor means connected to the input terminal of said inductance coil means in a shunt manner and second capacitor means connected to the output terminal of said inductance coil means in a shunt manner, said stray capacitance being shunted by said first capacitor means, said inductance coil means and said first and second capacitor means and said stray capacitance constituting a tuned or resonance circuit. Since the resonance circuit is formed with the said inductance coil means and a series connection of said first and second capacitor means in terms of an equivalent circuit, the resultant capacitance value of series connected first and second capacitor means serves to determine the resonance frequency of the resonance circuit. As is well known to those skilled in the art, series connection of two capacitors results in a reduced value of capacitance as compared with each capacitance value of these capacitors. Therefore, an increased inductance value of the inductance coil means can be selected. Nevertheless, the above discussed adverse effect of the bearing stray capacitance at the output of the high frequency amplifying transistor means is solely related with the capacitance value of said first capacitor means in terms of the equivalent circuit. Since each of the first and second capacitor means has a relatively larger capacitance value, as described previously, it would be appreciated that the above discussed adverse effect of the stray capacitance at the output of the high frequency amplifying transistor means can be reduced by the fact that the said stray capacitance is solely related with the said first capacitor means whereas in the FIG. 1 prior art apparatus the stray capacitance at the output of the high frequency amplifying transistor means was related with the resultant composite capacitance value of the series connected two capacitors. Nevertheless, the inventive tuner employs a single tuned coupling circuit interconnected between the high frequency amplifying transistor means and the mixer means. Hence, the advantage of the single tuned coupling circuit is maintained even in adoption of a π type circuit.

Therefore, a principle object of the present invention is to provide an improved VHF tuner comprising a single tuned coupling circuit between the high frequency amplifying transitor means and mixing means.

Another object of the present invention is to provide an improved VHF tuner comprising high frequency amplifying transistor means of an automatic gain control type, frequency converting means, and single tuned coupling means interconnected between the output of said high frequency amplifying transistor means and the input of said frequency converting means, wherein said single tuned coupling means has been adapted to be immune to variation of a stray capacitance at the output of said high frequency amplifying transistor means caused by variation of the magnitude of the automatic gain control signal to be applied to said high frequency amplifying transistor means.

A further object of the present invention is to provide an improved VHF tuner comprising high frequency amplifying transistor means, frequency converting means and single tuned coupling means interconnected between the output of said high frequency amplifying transistor means and the input of said frequency converting means, wherein connection of neutralizing capacitor means is improved.

Still a further object of the present invention is to provide an improved VHF tuner comprising high frequency amplifying transistor means, frequency converting means, and tuned coupling means interconnected between the output of said high frequency amplifying transistor means and the input of said frequency converting means wherein said tuned coupling means is simplified in structure.

These and other objects, features, aspects, and advantages of the present invention will become more apparent from the following detailed description of the preferred embodiments of the present invention made in conjunction with the accompanying drawings.

BRIEF DESCRIPTION OF THE DRAWINGS

FIG. 11(a) shows an equivalent circuit where an interference signal of high frequency component is considered whereas FIG. 11(b) shows an equivalent circuit where an interference signal of lower frequency component is considered.

DESCRIPTION OF THE PREFERRED EMBODIMENTS

Figure 4A:
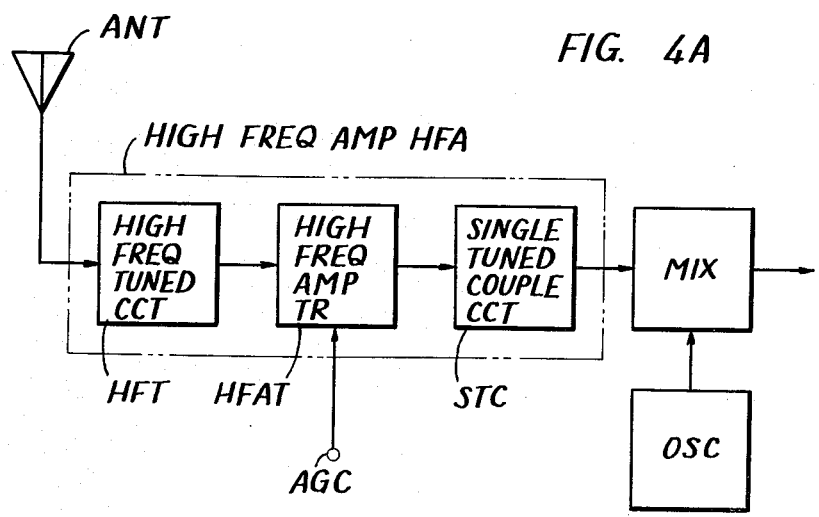
FIG. 4A is a block diagram of a typical VHF tuner, in which the present invention can be advantageously employed.

FIG. 4A is a block diagram of a typical VHF tuner, in which the present invention can be advantageously employed. The tuner is shown connected to an antenna ANT for receiving a broadcasting wave and comprises a high frequency amplifier HFA for selectively amplifying the selected high frequency signal, a local oscillator OSC for providing an oscillation frequency signal the frequency of which is different by a given frequency difference from said selected high frequency signal, and mixing means responsive to said received high frequency signal and said local oscillation frequency signal for providing an intermediate frequency signal. The high frequency amplifier HFA comprises a high frequency tuning circuit HFT, a high frequency amplifying transistor circuit HFAT and a single tuned coupling circuit STC. Typically, the high frequency amplifying transistor circuit HFAT is of an automatic gain control type. Hence, the transistor circuit HFAT is shown connected to receive an automatic gain control signal AGC. Detailed structure and operation of the high frequency tuned circuit HFt, the high frequency amplifying transistor circuit HFAT of an automatic gain control type, the mixer MIX and the oscillator OSC are well known to those skilled in the art. Hence, it is not believed necessary to describe the same in more detail for the purpose of describing the present invention. The present invention is directed to an improvement of the single tuned coupling circuit STC. As discussed previously, a tuned coupling circuit may be classified as a double tuned coupling circuit, i.e. a pair of inductively coupled tuned circuits, and a single tuned coupling circuit. It is pointed out that the present invention is directed to an improvement in a single tuned coupling circuit to be employed for intercoupling of a high frequency amplifying transistor circuit of an automatic gain control type and a mixer, wherein the said single tuned coupling circuit comprises a plurality of inductance coil means and a mechanical selecting scheme for selecting a desired one of said plurality of inductance coil means for the purpose of selection of a desired high frequency broadcasting signal.

Figure 1:
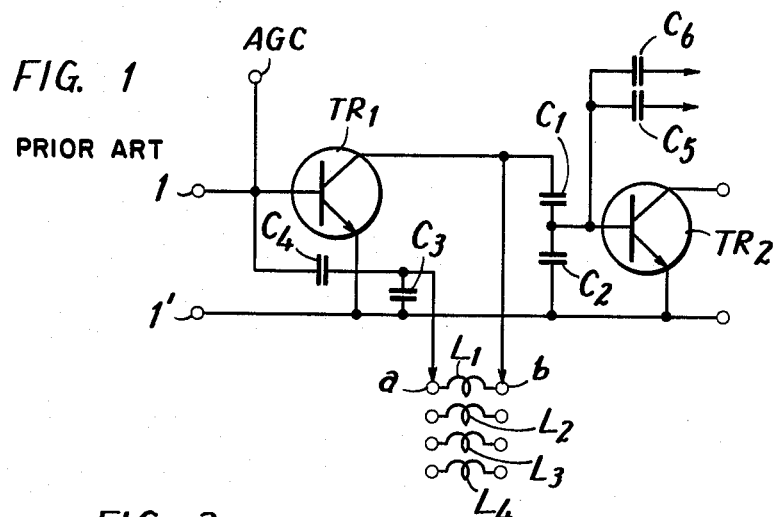
FIG. 1 shows a schematic diagram of only a major portion of a typical conventional turret type tuner for use in a VHF television receiver.
Figure 4:
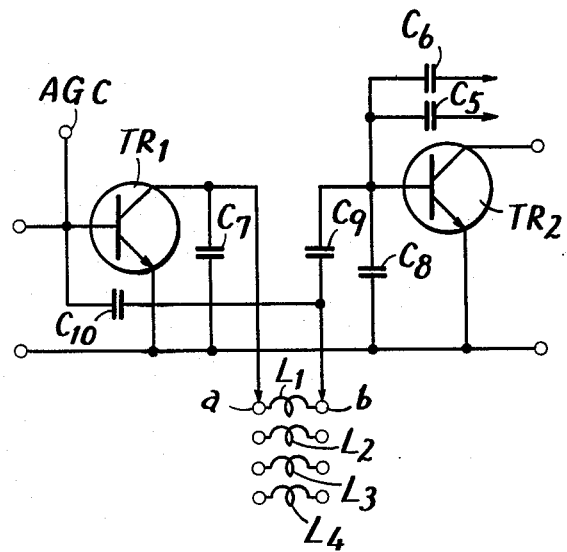
FIG. 4 shows a schematic diagram of only a major portion of a turret type VHF tuner for use in a VHF television receiver.

FIG. 4 shows a schematic diagram of only a major portion of a turret type VHF tuner for use in a VHF television receiver. Referring to FIG. 4, the tuner is shown comprising a transistor TR1 implementing a high frequency amplifier of an automatic gain control type and a transistor TR2 implementing a frequency converter, interconnected by a single tuned coupling circuit comprising an inductance coil and capacitors connected thereto. The said single tuned coupling circuit comprises a selected one of tuning inductance coils L1, L2, L3, . . . , which is arranged between the high frequency amplifier and the frequency converter in a series fashion, and a capacitor C7 and a series connection of capacitors C8 and C9 connected at the input and the output sides thereof, respectively, both in a shunt fashion, whereby a $\pi$ type tuned circuit is formed. More specifically, the inductance coil L1, L2, L3, . . . , are provided on a turrent plate such that each is individually associated with each television channel, whereby rotation of the tuner shaft makes mechanically selective connection of each coil to the terminals a and b. As described previously, the transistors TR1 and TR2 each comprises a typical bipolar type transistor of NPN type having collector, base and emitter electrodes and connected in a common emitter fashion. In the FIG. 4 diagram the capacitor C9 has been inserted for the purpose of obtaining a neutralizing signal. The neutralizing signal obtained at the junction b of the capacitor C9 and the inductance coil is applied through a neutralizing capacitor C10 to the base electrode of the transistor TR1. The neutralizing signal and the neutralizing capacitor were fully discussed previously with reference to FIG. 1. The base electrode of the transistor TR1 is also connected to receive the above described automatic gain control signal through the terminal AGC. The remaining portions of the FIG. 4 diagram are substantially the same as those of the FIG. 1 diagram. Hence a further description of those remaining portions will be omitted for simplicity of description.

Figure 5:
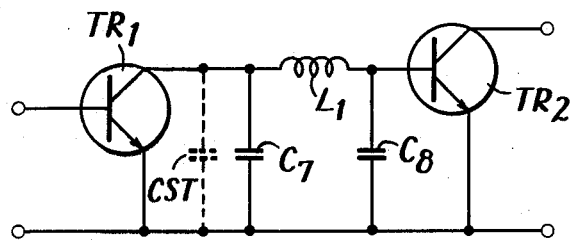
FIG. 5 shows a simplified schematic diagram of the FIG. 4 tuner where a specified channel is selected, wherein the neutralizing circuit has been omitted for simplicity of consideration of the circuit.

FIG. 5 shows a simplified schematic diagram of the FIG. 4 tuner where a specified channel is selected, wherein the neutralizing circuit has been omitted for simplicity of consideration of the circuit. Since like portions have been denoted by the same reference characters, the circuit connection is again self-explanatory. As well known to those skilled in the art, the transistor TR1 has a stray capacitance between the collector electrode and the emitter electrode. Such stray capacitance has been shown in a dotted line as CST in FIG. 5. As described previously, the capacitance value of the said stray capacitance CST varies as a function of the magnitude of the automatic gain control signal to be applied to the input electrode of the transistor TR1. From FIG. 5, it is better seen that the inventive single tuned coupling circuit comprises a $\pi$ type single tuned circuit comprising the inductance coil L1 arranged in a series fashion and the input and output capacitors C7 and C8 connected to the input and output sides of the coil L1, respectively, in a shunt fashion, the input capacitor C7 being shunted with the said stray capacitance CST.

Figure 6:
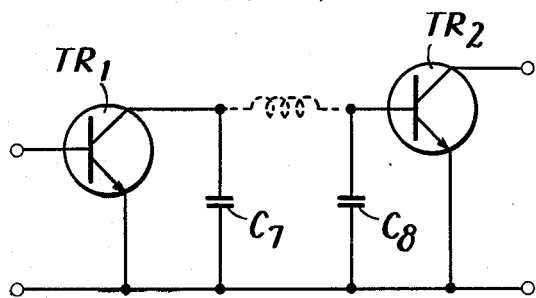
FIG. 6 shows an equivalent circuit of the FIG. 5 diagram with respect to a higher receiving signal.

Now the operation of the inventive VHF tuner will be considered. The higher the frequency of the receiving high frequency signal becomes, the smaller the load impedance of the above described high frequency amplifying transistor TR1 becomes because of the input capacitor C7 serving as a load of the high frequency amplifying transistor TR1 whereas the larger the coupling impedance by way of the inductance coil L1 becomes to be sufficient enough to be negligible. FIG. 6 shows an equivalent circuit of the FIG. 5 diagram with respect to such a high receiving signal. It can be seen from FIG. 6 that the inventive circuit configuration serves to effectively remove an interference signal of a higher frequency from the received broadcasting signal. In other words, the input capacitor C7 of the inventive $\pi$ type single tuned coupling circuit serves to bypass to the ground an interference signal of a higher frequency component included in the output signal from the high frequency amplifying transistor TR1. On the other hand, the inductance coil arranged in a series fashion serves to block such an interference signal of a higher frequency component from being transferred to the subsequent frequency converting stage.

Now the above described adverse affect of the output stray capacitance of the high frequency amplifying transistor upon the tuned circuit and thus to the tuning frequency of the single tuned coupling circuit will be considered. Referring again to FIG. 5, it can be seen that the tuning frequency of the inventive single tuned coupling circuit is determined as a function of $\sqrt{LC}$ where L is the inductance of the inductance coil L1 and C is the resultant composite capacitance of the capacitors CST, C7 and C8. The capacitance C may be expressed as $(CST+C7)C8/CST+C7+C8$. Since the composite capacitance C is substantially determined as a series connection of two capacitors C7 and C8, the capacitance of each capacitor is larger than, say as large as two times of, the said composite capacitance. In other words, in order to attain a given smaller resultant composite capacitance C, the capacitors C7 and C8 of relatively a two-time larger capacitance can be employed. However, it is important to note that with the inventive single tuned coupling circuit only the input capacitor C7 is dominantly related with the output stray capacitance CST of the high frequency amplifying transistor TR1 with respect to the signal frequency. Thus the ratio of the stray capacitance CST to the capacitance of the input capacitor C7 can be reduced to a smaller value than, say as small as a half of, the ratio value discussed previously in conjunction with the FIG. 2 prior art circuit. Thus, it can be understood that any adverse affect caused by variation of the stray capacitance CST occurring as a function of the magnitude of the automatic gain control signal can be reduced to relatively a small value, say as small as a half of that of the FIG. 2 prior art circuit. If such reduction of the adverse affect had been effected by increasing the composite capacitance of the capacitors C1 and C2 in the FIG. 2 prior art apparatus, the inductance of the inductance coil L1 should have been decreased to a smaller value of as small as a half; this could have made much more difficult fabrication of the inductance coil L1, however. By contrast, the present invention can achieve such reduction of the adverse affect of the varying stray capacitance CST without reducing the inductance value of the inductance coil L1. Thus, the tuning or resonance frequency of the inventive single tuned coupling circuit can be stabilized irrespective of the varying output stray capacitance of the high frequency amplifying transistor TR1.

Figure 2:
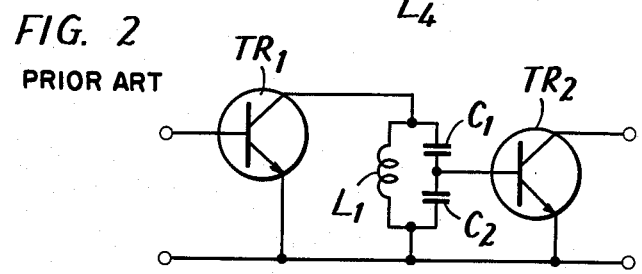
FIG. 2 shows a simplified schematic diagram of the FIG. 1 tuner where a specified channel is selected, wherein the neutralizing circuit has been omitted for simplicity of consideration of the circuit.
Figure 3:
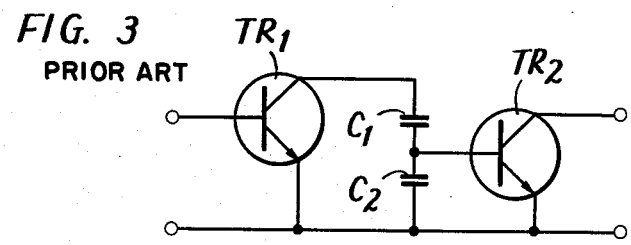
FIG. 3 shows an equivalent circuit of the FIG. 2 diagram with respect to a high frequency interference signal wherein the inductance coil L1 has been omitted.
Figure 7:
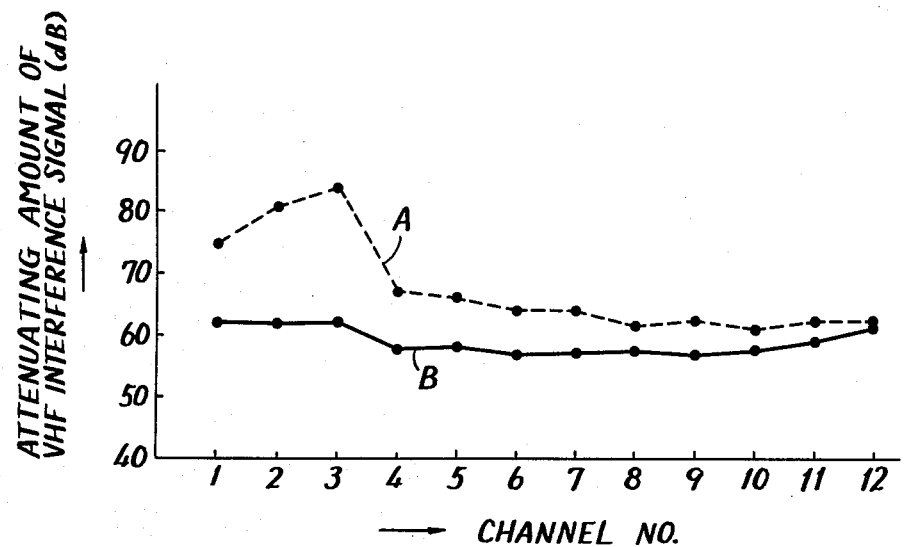
FIG. 7 is a graph showing a comparison of the attenuating amount of an interference signal among the FIG. 5 inventive tuner and the FIG. 2 prior art tuner.

FIG. 7 is a graph showing a comparison of the attenuating amount of an interference signal among the FIG. 5 inventive tuner and the FIG. 2 prior art tuner, wherein the abscissa shows the receiving television channels whereas the ordinate shows the attenuating amount of the interference signal of the frequency higher than the local oscillation frequency by 56.5 MHz with respect to the desired receiving signal, the curve A being for the inventive tuner and the curve B for the FIG. 2 prior art tuner. The comparison in the FIG. 7 graph substantiates superiority of the inventive tuner with respect to supression of an undesired interference signal of a higher frequency component.

Figure 8:
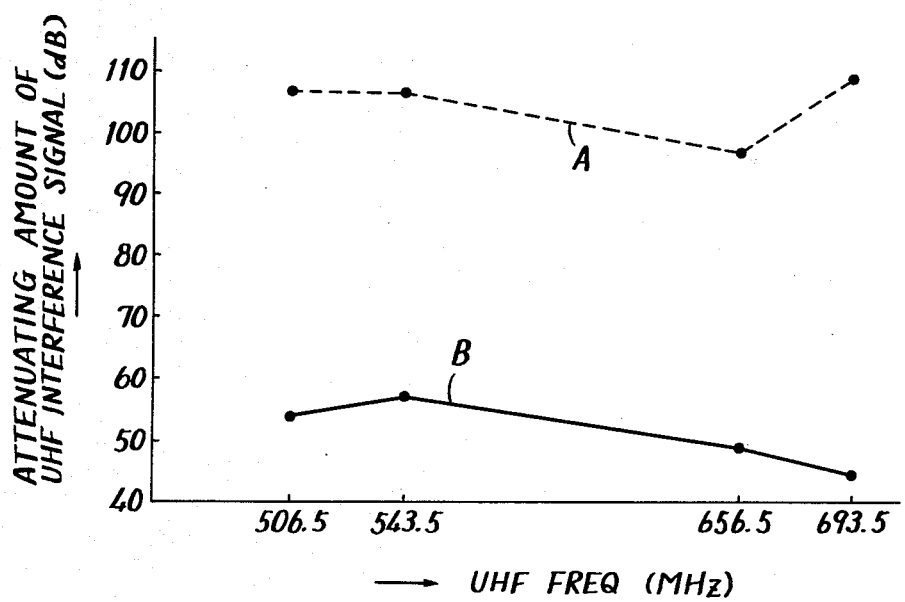
FIG. 8 is a graph showing a comparison similar to that in FIG. 7 but showing a comparison of the attenuating amount of an interference signal of a UHF frequency component.

FIG. 8 is a graph showing a comparison similar to that in FIG. 7 but showing a comparison of the attenuating amount of an interference signal of a UHF frequency component, wherein the abscissa shows the UHF band frequencies much higher than the frequencies of the VHF tuner whereas the ordinate shows the attenuating amount of a UHF interference signal which is difficult from the harmonic frequency nf0 of the local oscillation frequency by the difference frequency of 56.5 MHz with respect to the desired receiving signal, the curve A being for the inventive tuner and the curve B for the FIG. 2 prior art tuner. It can be seen that the inventive tuner shows a much more improved feature with respect to an interference signal of a UHF band frequency.

Incidentally stated with reference to FIG. 8, the frequency of 506.5 MHz could interact with the frequency of 450 MHz that is the third harmonic of the local oscillation frequency 150 MHz for the channel No. 1 of the Japanese standard television system to cause the difference frequency of 56.5 MHz (506.5−450=65.5). Similarly the frequency of 543.5 MHz could interact with the fourth harmonic 600 MHz of the above described frequency 150 MHz to cause the difference frequency 56.5 MHz (600−543.5=56.5). Similarly the signal of the frequency 656.5 MHz could interact with the fourth harmonic 600 MHz to cause the difference frequency 56.5 MHz (656.5−600=56.5). Thus these frequencies of 506.5 MHz, 543.5 MHz, 656.5 MHz and the like would be an interference signal when the channel No. 1 of the VHF television is received. However, with the inventive apparatus, such an interference signal can be effectively suppressed. Similarly, in receiving the broadcasting singal of the channel No. 2, the frequencies 506.5 MHz, 543.5 MHz, 656.5 MHz and the like could be an interference signal; these can also be effectively supressed with the inventive apparatus, however.

Figure 9:
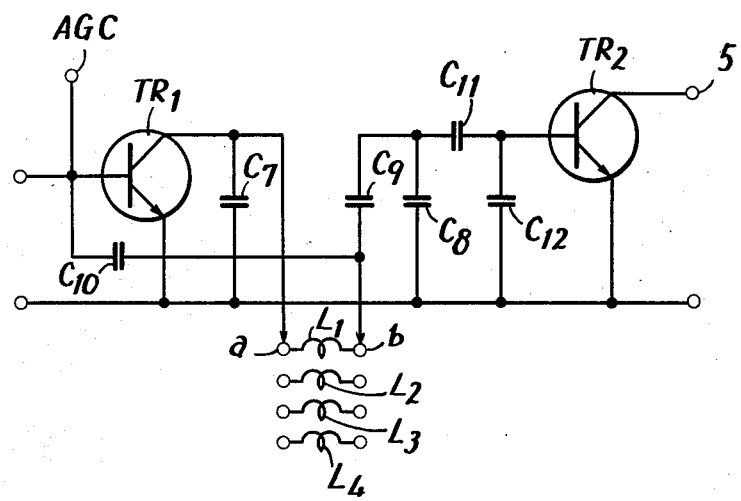
FIG. 9 shows a schematic diagram of another embodiment of the inventive tuner.

FIG. 9 shows a schematic diagram of another embodiment of the inventive tuner. The FIG. 9 embodiment additionally comprises a capacitance dividing circuit comprising a series connection of capacitors C11 and C12. The input electrode of the frequency converting transistor TR2 is connected to the junction of the capacitors C11 and C12. Because the capacitor C8 is shunted by the series connection of the capacitor C11 and C12, the capacitance of the capacitor C8 is accordingly decreased as compared with the capacitance of the capacitor C8 in the FIG. 4 embodiment. The other portions of the FIG. 9 embodiment are substantially the same and therefore the same reference characters have been used to denote the same portions.

Figure 10:
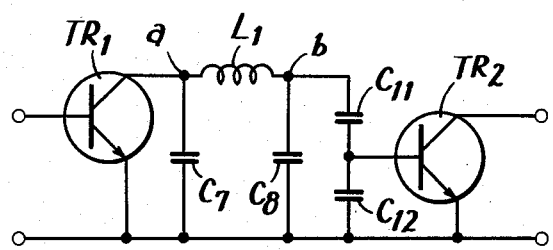
FIG. 10 is similar to the FIG. 5 circuit but shows an equivalent circuit of the FIG. 9 embodiment.
Figure 11:
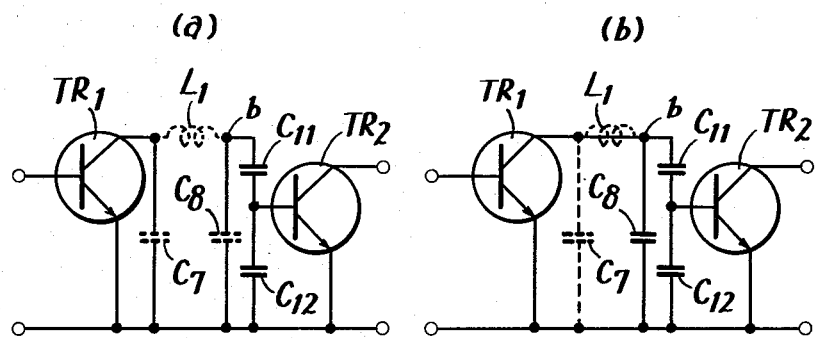
FIG. 11 shows similar equivalent circuits, where

FIG. 10 is similar to the FIG. 5 circuit but shows an equivalent circuit of the FIG. 9 embodiment. FIG. 11 shows similar equivalent circuits, wherein FIG. 11(a) shows an equivalent circuit where an interference signal of higher frequency component is considered whereas FIG. 11(b) shows an equivalent circuit where an interference signal of lower frequency component is considered. It is pointed out that in FIG. 11 those components of the impedance which is relatively large with respect to the frequency now in consideration and thus is negligible have been indicated as a dotted line component symbol and a dotted line connecting line while those components of the impedance which is relatively small with respect to the frequency now in consideration sufficient enough to be regarded as a short circuit have been shown as a dotted line component symbol together with a solid line connecting line.

Now referring to FIGS. 9 through 11, the tuned coupling circuit of the embodiment shown also comprises basically a $\pi$ type tuned circuit. Thus, if and when the desired receiving frequency signal is received, a larger impedance value of the inductance coil L1 becomes dominant, whereby the interference signal of a higher frequency component is blocked from being transferred to the subsequent frequency converting stage, as seen from FIG. 11(a). On the other hand, if and when a signal of the frequency lower than the desired receiving frequency is received, the FIG. 11(b) equivalent circuit is applicable. In this circuit configuration adoption of an increased capacitance value of the capacitor C8 make it possible to adopt a decreased capacitance value of the capacitor C11 and accordingly makes an interference signal of the frequency lower than the receiving signal frequency be easily bypassed through the capacitor C8 and be easily blocked from being transferred to the frequency converting transistor TR2 through the capacitor C11, with the result than an interference signal of much lower frequency can be effectively suppressed so as not to enter the frequency converting transistor TR2.

Figure 12:
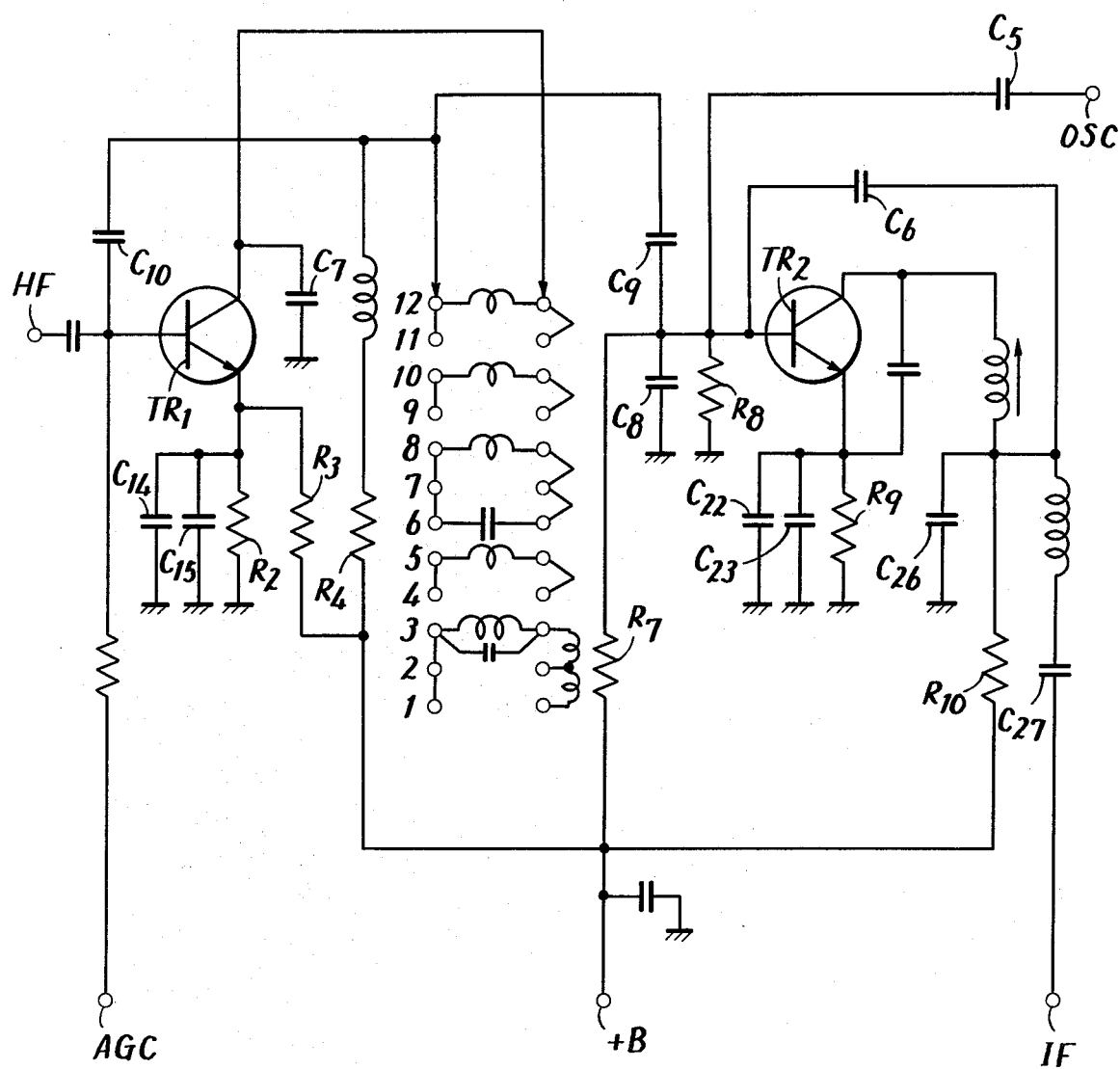
FIG. 12 shows a schematic diagram of one example employing the FIGS. 4 through 6 embodiment.

Referring to FIG. 10, it can be seen that the input electrode of the frequency converting transistor TR2 is connected from the junction of the capacitors C11 and C12 constituting the capacitance dividing circuit. Assuming the input impedance of the frequency converting transistor TR2 of the FIG. 10 embodiment is the same as that of the FIG. 5 embodimet, employment of the capacitance dividing circuit make it possible to increase the impedance at the output point b of the $\pi$ type tuned circuit. This means that if the capacitance of the input capacitor C7 of the FIG. 10 embodiment is the same as that of the FIG. 5 embodiment the resultant composite capacitance of the output side of the FIG. 10 tuned coupling circuit can be selected to be smaller than that of the capacitor C8 of the FIG. 5 embodiment. This accordingly make it possible to adopt any desired decreased capacitance value for the capacitor C11 when an increased capacitance value is adopted for the capacitor C8. As a result, it is easy to determine a decreased capacitance value for the capacitor C11 small enough to effectively supress an interference signal of a lower frequency. Thus, the FIGS. 9 through 11 embodiment is much more advantageous in that interference signals of both higher and lower frequencies can be effectively suppressed FIG. 12 shows a FIG. 12 shows a schematic diagram of one example employing the FIGS. 4 through 6 embodiment. Hence, the same reference characters have been used to designate the same portions. The following is a list of the components used in the FIG. 12 embodiment.

C10 ... 0.5~1.0 pF
C7 ... 1.5 pF
C9 ... 39 pF
C8 ... 33 pF
C5 ... 2 pF
C6 ... 0.5~1.5 pF
C14 ... 1.2 $\mu$F
C15 ... 2.2 $\mu$F
C22 ... 1 $\mu$F
C23 ... 1 $\mu$F
C26 ... 47 pF
C27 ... 82 pF
R2 ... 270$\Omega$
R3 ... 1.2K$\Omega$
R4 ... 180$\Omega$
R7 ... 12K$\Omega$
R8 ... 2.2K$\Omega$
R9 ... 1K$\Omega$
R10 ... 1K$\Omega$ Although this invention has been described and illustrated in detail, it is to be clearly understood that the same is by way of illustration and example only and is not to be taken by way of limitation, the spirit and scope of this invention being limited only by the terms of the appended claims.

What is claimed is:

1. A very high frequency tuner for selecting one of a plurality of broadcasting signals, comprising high frequency amplifying transistor means of an automatic gain control type for amplifying a high frequency signal, said high frequency amplifying transistor means having a stray capacitance at the output thereof, said high frequency amplifying means being connected to receive an automatic gain control signal, tuned coupling means coupled to said high frequency amplifying transistor means for selectively withddrawing a tuned high frequency signal, said coupling means including a plurality of inductance coil means and mechanical switching means for coupling a selected one of said inductive coil means into said coupling means, local oscillating means for providing an oscillation frequency signal the frequency of which is different by a given frequency difference from said selectively withdrawn tuned high frequency signal, mixing means responsive to said tuned high frequency signal from said tuned coupling means and said local oscillation frequency from said local oscillating means for providing an intermediate frequency signal, said tuned coupling means comprising a $\pi$type single tuned coupling circuit means for preventing image interference and for reducing the effect of the stray capacitance of said amplifying transistor means, said coupling circuit means comprising said mechanically selected inductance coil means connected in series between the output of said high frequency amplifying transistor means and the input of said mixing means, first capacitor means connected to the input terminal of said inductance coil means in a shunt manner and a second capacitor means connected to the output terminal of said inductance coil means in a shunt manner, said stray capacitance of said high frequency amplifying transistor means being shunted by said first capacitor means.

2. A very high frequency tuner in accordance with claim 1, wherein said second capacitor means comprises capacitance dividing means including a series connection of two capacitor means, the junction of said two capacitor means being coupled to said mixing means, whereby the input impedance of said mixing means is matched.

3. A very high frequency tuner in accordance with claim 1, wherein said tuned coupling means comprises neutralizing signal generating means, and a neutralizing capacitor means for coupling a neutralizing signal obtainable from said neutralizing signal generating means to the input of said high frequency amplifying transistor means.

4. A very high frequency tuner in accordance with claim 3, wherein said neutralizing signal generating means includes the junction of said inductance coil means and said second capacitor means.

* * * * *